(12) United States Patent
Sulyman et al.

(10) Patent No.: US 12,381,109 B2
(45) Date of Patent: Aug. 5, 2025

(54) HERMETIC TUBULAR LINEAR MOTOR BASED WAFER LIFT ACTUATOR

(71) Applicant: Applied Materials, Inc., Santa Clara, CA (US)

(72) Inventors: Alexander Sulyman, San Francisco, CA (US); Phillip Alfred Criminale, Liberty Hill, TX (US); Cory Bowdach, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 456 days.

(21) Appl. No.: 18/087,187

(22) Filed: Dec. 22, 2022

(65) Prior Publication Data
US 2024/0145291 A1     May 2, 2024

Related U.S. Application Data

(60) Provisional application No. 63/420,022, filed on Oct. 27, 2022.

(51) Int. Cl.
| | |
|---|---|
| H01L 21/687 | (2006.01) |
| H01L 21/683 | (2006.01) |
| H02K 11/22 | (2016.01) |
| H02K 41/03 | (2006.01) |

(52) U.S. Cl.
CPC .... *H01L 21/68742* (2013.01); *H01L 21/6833* (2013.01); *H02K 11/22* (2016.01); *H02K 41/031* (2013.01)

(58) Field of Classification Search
CPC ............ C23C 16/4585; C23C 16/4586; H01L 21/6833; H01L 21/68742; H02K 11/22; H02K 41/031
See application file for complete search history.

(56) References Cited

U.S. PATENT DOCUMENTS

| | | | | |
|---|---|---|---|---|
| 5,879,128 | A | * 3/1999 | Tietz | H01L 21/68742 414/757 |
| 7,218,382 | B2 | 5/2007 | Kasumi | |
| 2020/0020566 | A1 | * 1/2020 | Inhofer | H01F 7/16 |
| 2022/0102188 | A1 | * 3/2022 | Tang | H01L 21/67259 |

FOREIGN PATENT DOCUMENTS

JP          H08316292 A    * 11/1996

* cited by examiner

*Primary Examiner* — Benjamin Kendall
(74) *Attorney, Agent, or Firm* — Moser Taboada

(57) ABSTRACT

Methods and system for lifting a substrate are provided. In some embodiments a system includes a processing chamber having a chamber body defining an interior space; and a linear motor comprising: a housing disposed outside of the interior space and sealed to the chamber body, the housing having a cavity in fluid communication with the interior space; and a slider disposed at least partially in the cavity, the slider configured to slide relative to the housing in the cavity.

17 Claims, 3 Drawing Sheets

HERMETIC TUBULAR LINEAR MOTOR BASED WAFER LIFT ACTUATOR

CROSS-REFERENCE TO RELATED APPLICATIONS

This application claims benefit of U.S. provisional patent application Ser. No. 63/420,022, filed Oct. 27, 2022, which is herein incorporated by reference.

FIELD

Embodiments of the present disclosure generally relate to linear motion control methods, systems, and apparatus, and more particularly to linear motor control in substrate processing chambers.

BACKGROUND

In process chambers utilizing an electrostatic chuck (ESC), a substrate can often become attached or clamped to the ESC due to an electrostatic clamping force caused by residual charge on ESC surface and/or substrate. When a substrate is strongly attached or clamped to the ESC, if a substrate lift actuator does not have adequate force measurement and force modulation, the substrate can be damaged from an application of a force to the substrate. Feeding linear motion into a vacuum typically uses some pneumatic/motorized actuator coupled with a bellows to serve as a vacuum-to-atmosphere break ("vacuum break") where the entire actuator is at atmospheric pressure surrounded by the bellows.

The inventors have observed that such bellows often have some spring force associated with their extension or compression that must be overcome when actuating the actuator. Also, since the bellows serve as the vacuum break, the force caused by atmospheric pressure acting on the bellows must also be overcome. Thus, due to the use of bellows, a substrate actuator used with the bellows must have a linear motor large enough to counter the spring force and atmospheric force on the bellows. Thus, novel systems, apparatus, and methods are provided that eliminate the need for such bellows.

SUMMARY

Methods, systems, and apparatus for lifting a substrate are provided herein. In some embodiments, a system for linear motion includes a processing chamber having a chamber body defining an interior space; and a linear motor comprising: a housing disposed outside of the interior space and sealed to the chamber body, the housing having a cavity in fluid communication with the interior space; and a slider disposed at least partially in the cavity, the slider configured to slide relative to the housing in the cavity.

In some embodiments, a linear motor includes: a housing having a cavity and a sealing flange configured to seal with a chamber body of a processing chamber; and a slider disposed at least partially in the cavity, the slider configured to slide relative to the housing in the cavity.

In some embodiments, a system for lift pin motion includes a processing chamber having a chamber body defining an interior space; a linear motor comprising: a housing disposed outside of the interior space and having a sealing flange sealed to the chamber body, the housing having a cavity in fluid communication with the interior space; and a slider disposed at least partially in the cavity, the slider configured to slide relative to the housing in the cavity; a substrate support disposed in the interior space, the substrate support having at least one through hole; and a lift pin extending from an end of the slider and moveable with the slider to cause movement of the lift pin through the at least one through hole.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
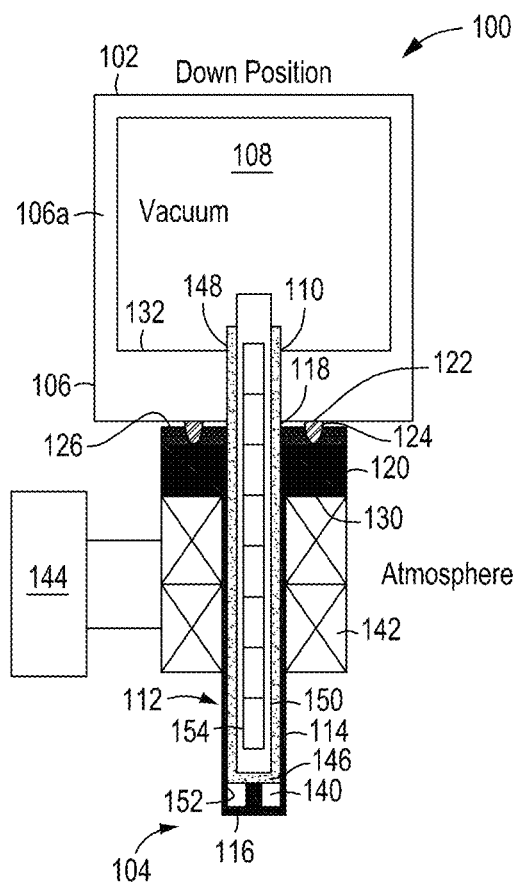
FIG. 1 is a cross-section of a system including an apparatus shown in a retracted configuration in accordance with an embodiment of the present disclosure

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods, systems, and apparatus for linear motion control are provided herein. In some embodiments, a linear motor having a housing sealed with a processing chamber can be used for providing linear motion in a processing chamber, such as, for lifting a substrate in the processing chamber. As will be described in greater detail below, embodiments of a linear motor in accordance with the present disclosure do not require the aforementioned bellows to provide a vacuum break. Therefore, such linear motors do not need to overcome the spring force and atmospheric force that are characteristic of any bellows used as a vacuum break. Thus, in the example of lifting a substrate from an electrostatic chuck, forces that are accounted for to control the linear motor may include friction, mass of slider, mass of lifting hardware, mass of substrate, and any clamping force on the substrate. Since bellow spring force and atmospheric force often accounts for a majority of load on a conventional linear motor, the lack of a bellows for embodiments of linear motors in accordance with the present disclosure can also permit use of a much smaller and lower power linear motors. Moreover, using a smaller linear motor can enhance force measurement and force modulation of the linear motor to facilitate detection of electrostatic clamping force on the substrate. In some embodiments, such detection of electrostatic clamping force may be employed in a closed loop feedback system to limit application of force to a substrate to prevent damage to the substrate, as will be described in greater detail below.

Figure 2:
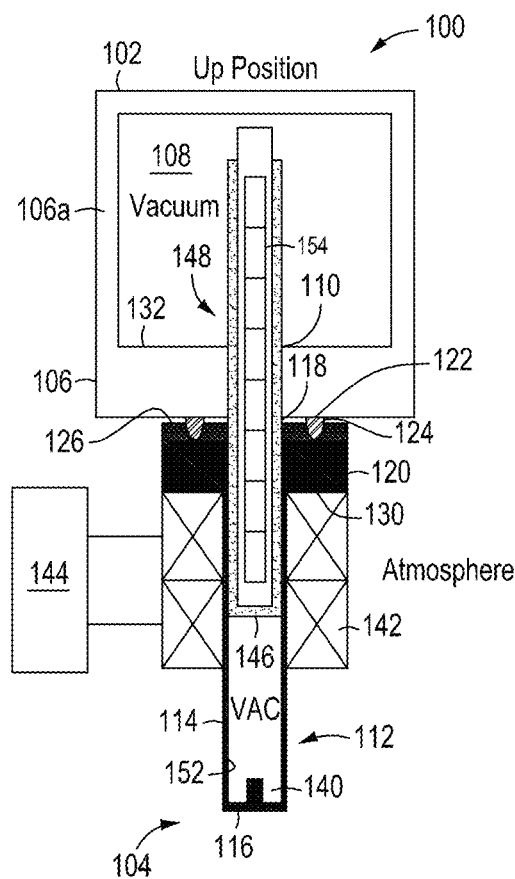
FIG. 2 shows the system of FIG. 1 with the in an extended configuration.

FIGS. 1 and 2 show an embodiment of a system 100 that includes a processing chamber 102 and a linear motor 104 coupled to the processing chamber 102. The processing chamber 102 includes a chamber body 106 having walls 106a surrounding and defining an interior space 108. The chamber body 106 may have a through hole 110.

In some embodiments, and as shown in FIGS. 1 and 2, the linear motor 104 may include a housing 112 disposed at least partially outside the interior space 108 and coupled to the chamber body 106 around the through hole 110. In some embodiments, and as shown in FIGS. 1 and 2, the housing 112 may include a solid tubular body 114 extending from a closed end 116 to an open end 118 aligned with or otherwise in communication with the through hole 110 in the chamber body 106. In some embodiments, the housing 112 may be made from metal, such as stainless steel or aluminum, or plastic, such as PTFE or Vesper) (registered trademark of DuPont de Nemours, Inc.) In some embodiments, the tubular body 114 may have a wall thickness of up to 0.05 inch. In some embodiments, the tubular body 114 may be formed from a polymer having a thickness of about 0.002 inch to 0.006 inch In some embodiments, and as shown in FIGS. 1 and 2, the housing 112 may also include a sealing flange 120 surrounding the open end 118 and around the through hole 110 in the chamber body 106. The sealing flange 120 is configured to seal to the chamber body 106 with a vacuum seal 122, such as an O-ring (e.g., vacuum O-ring). In some embodiments, and as shown in FIGS. 1 and 2, the sealing flange 120 may include a groove 124 for seating an O-ring.

In some embodiments, and as shown in FIGS. 1 and 2, an upper side 126 of the sealing flange 120 may face and be sealed to an outer side 128 of the chamber body 106. In some embodiments, a lower side 130 of the sealing flange 120 may face and seal with an inner side 132 of the chamber body 106 so that the tubular body 114 extends fully through the through hole 110. In such an embodiment, the lower side 130 of the sealing flange 120 may be configured like the upper side 126 and may have the groove 124 and the vacuum seal 122 on the lower side 130.

The housing 112 may couple to the chamber body 106 in various ways to retain the housing 112 sealed to the processing chamber 102. For example, the housing 112 may connect to the chamber body 106 by a threaded connection, such as between the chamber body 106 and the sealing flange 120, or by one or more fasteners (e.g., screws) between the sealing flange 120 and the chamber body 106. In some embodiments, the chamber body 106 may have an external fitting, such as a sealing flange complementary to the sealing flange 120 of the housing 112 such that the housing 112 connects to the chamber body 106 indirectly through such external fitting.

In some embodiments, and as shown in FIGS. 1 and 2, the housing 112 defines a cavity 140 extending from the closed end 116 to the open end 118. Due to the open end 118 and the vacuum seal 122, the cavity 140 may be sealed in fluid communication with the interior space 108 so that the cavity is not in fluid communication with the environment outside the processing chamber 102 or the housing 112. Therefore, in an example where the pressure in the interior space 108 is maintained at a vacuum, the pressure in the cavity 140 will also be at a vacuum. In such an example, the housing 112 and the vacuum seal 122 provide a vacuum break.

In some embodiments, and as shown in FIGS. 1 and 2, the linear motor 104 may include at least one electromagnetic coil 142 (two are shown) wound around at least a portion of the tubular body 114 of the housing 112. The electromagnetic coils 142 may be connected to a motor controller 144 configured to control power to the electromagnetic coils 142 to generate an electromagnetic field, as discussed more fully below. Thus, the electromagnetic coils 142 may be configured as a stator of the linear motor 104.

In some embodiments, and as shown in FIGS. 1 and 2, the linear motor 104 may include a slider 146 disposed at least partially in the cavity 140. The slider 146 is configured to move in the cavity 140 relative to the housing 112. In some embodiments, and as shown in FIGS. 1 and 2, the slider 146 may include a tubular sleeve 148. The sleeve 148 has an outer bearing surface 150 configured to slide along an inner wall 152 of the tubular body 114 of the housing 112. Also, in some embodiments, and as shown in FIGS. 1 and 2, the tubular sleeve 148 surrounds a plurality of stacked permanent magnets 154. As shown in FIG. 1, the slider 146 is in a fully retracted position. In operation, the electromagnetic coils 142 may be powered by the motor controller 144 to generate a magnetic field that interacts with the magnets 154 to cause the slider 146 to move relative to the housing 112 to an extended position shown in FIG. 2. In the embodiment shown in FIG. 2, at least an upper portion of the slider 146 is displaced into the interior space 108 of the processing chamber 102.

The tubular sleeve 148 may be formed of PTFE, Vesper) (registered trademark of DuPont de Nemours, Inc.), or other plastics. In some embodiments, the tubular sleeve 148 may have a thickness of up to 0.05 inches thick. In some embodiments, the tubular sleeve 148 may be formed from a polymer coating coated over the magnets 154 having a thickness of about 0.002 inch to 0.006 inch. Such thin polymer coating may be advantageous to increase proximity of magnets 154 and electromagnetic coils and thus increase magnetic coupling.

Figure 3:
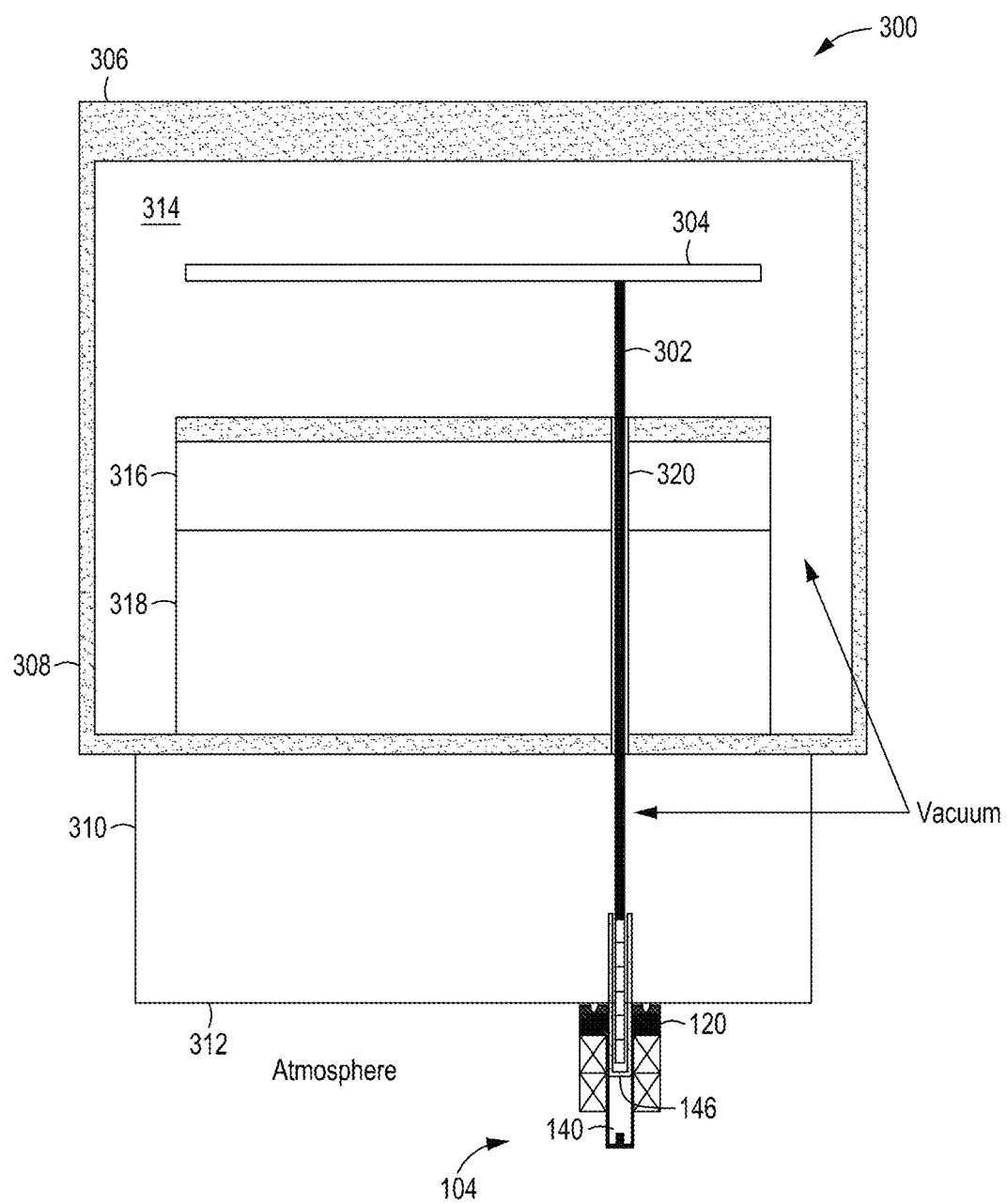
FIG. 3 shows a cross-section of a system in accordance with an embodiment of the present disclosure.

The linear motor 104 shown in FIGS. 1 and 2 may be adapted for various uses where linear motion in a vacuum is desired. For example, FIG. 3 shows another system 300 where the linear motor 104 may be used for controlling motion of a lift pin 302 for lifting a substrate 304 in a vacuum. In the embodiment shown in FIG. 3, the system includes a processing chamber 306 having a chamber body 308 connected to a cathode base 310 at a lower end of the chamber body 308. The linear motor 104 may be connected to a lower side 312 of the cathode base 310. The chamber body 308 defines an interior space 314 housing a substrate support 316 (which may include an electrostatic chuck) configured to support the substrate 304 in a processing position, and an insulator plate 318 supporting the substrate support 316. The insulator plate 318 may be supported by the cathode base 310.

In some embodiments, and as shown in FIG. 3, a through hole 320 extends through the substrate support 316, the insulator plate 318, and the cathode base 310. The linear motor 104 is coupled to the cathode base 310 so that the sealing flange 120 is sealed to the lower side 312 of the cathode base 310 and the through hole 320 is in fluid communication with the cavity 140 of the linear motor 104. As shown in FIG. 3, the lift pin 302 may be supported by the slider 146 and extend in the through hole 320. The lift pin 302 is configured to move in the through hole 320 relative to the substrate support 316, the insulator plate 318, and the cathode base 310. As shown in FIG. 3, in some embodiments, the slider 146 may be raised as described above to lift the lift pin 302 in the through hole 320 to cause the substrate 304 to lift away from the substrate support 316 to a raised position.

In some situations, an electrostatic clamping force between the substrate 304 and an electrostatic chuck of the substrate support 316 may be present before the lift pin 302 contacts the substrate 304 to lift the substrate 304. In some embodiments, the system 300 may be configured to detect the presence and or magnitude of the residual clamping force on the substrate 304. Since bellows are not used as a vacuum break with the linear motor 104, the linear motor 104 may be directly coupled to the substrate 304 via the lift pin 302, such that there is no need to overcome any spring force and atmospheric force characteristic of bellows. Thus, in some embodiments, the clamping force on a substrate 304 may be detected by monitoring motor current (i.e., through electromagnetic coils 142) and correlating such motor current to residual clamping force on the substrate 304. Thus, for example, upon making contact between the lift pin 302 and the substrate 304 a large rise in motor current is detected, the system 300 may determine that the substrate 304 is still clamped.

Figure 4:
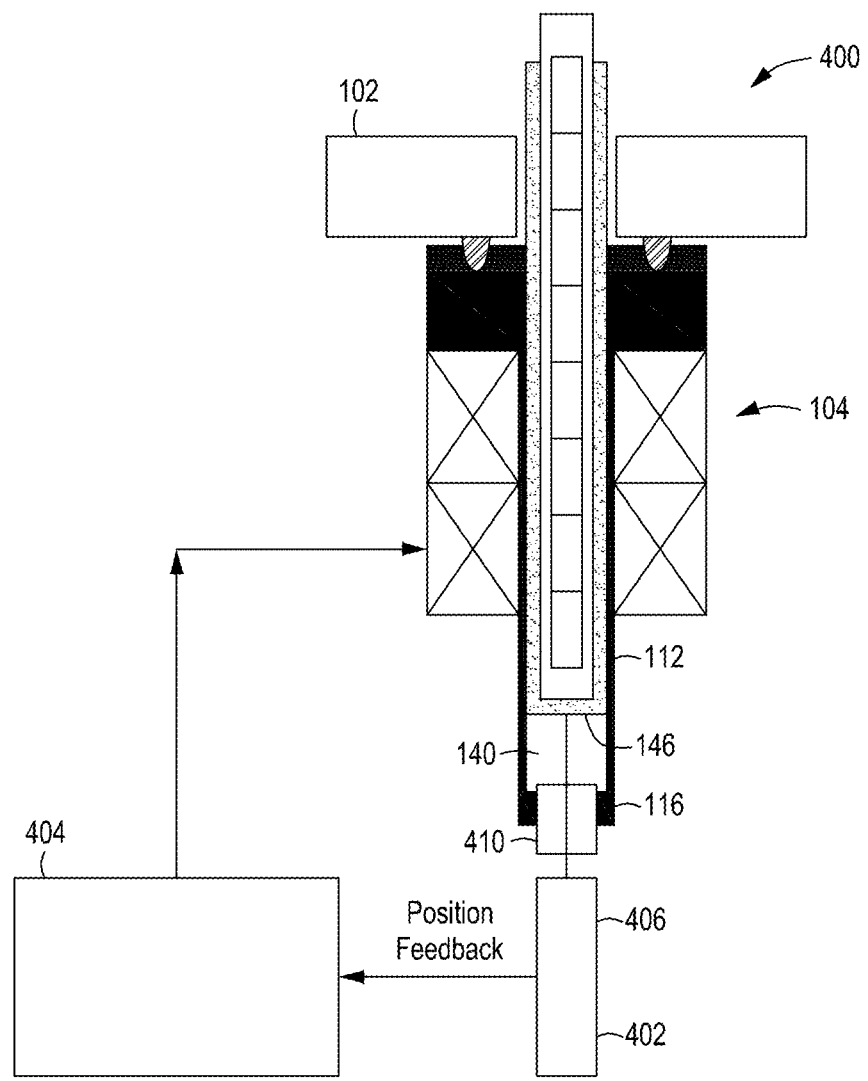
FIG. 4 shows a schematic cross-section of a system in accordance with an embodiment of the present disclosure.

FIG. 4 shows an embodiment of a position control system 400 in accordance with the disclosure. Specifically, FIG. 4 shows the linear motor 104 of FIGS. 1 and 2 adapted to implement a position control system. In some embodiments, and as shown in FIG. 4, the position control system 400 includes the linear motor 104 (modified as noted below), a position measurement device 402, and a controller 404. The position measurement device 402 may be configured to measure a position of the slider relative to the housing. In some embodiments, the position measurement device 402 may be coupled to the housing 112 or may be remote. Also, in some embodiments, the controller 404 may be configured to control power to the at least one electromagnetic coil 142 based on the measured position. In some embodiments, the controller 404 may be configured as a motor servo controller.

In some embodiments, and as shown in FIG. 4, the position measurement device 402 may include a laser interferometer 406 optically coupled to the slider 146. Specifically, as shown in FIG. 4, the closed end 116 of the housing may be modified to include a window 410 (e.g., sapphire) to permit optical transmission through the window 410. In some embodiments the window 410 may be replaced with an optical fiber feedthrough. As shown in FIG. 4, the laser interferometer 406 may be configured to direct laser light through the window 410 to the slider 146. The laser interferometer 406 is configured to measure displacement of the slider 146 in the cavity 140 and, thus, the position of the slider 146 relative to the housing 112.

In some embodiments, the position measurement device 402 may include an inductive linear measurement encoder, such as an AMOSIN® length measuring encoder (a registered trademark of AMO GmbH). In some embodiments, the position measurement device 402 may include a magnetic linear measurement encoder. In some embodiments, the position measurement device 402 may include a Hall effect sensor.

While the foregoing is directed to embodiments of the present disclosure, other and further embodiments of the disclosure may be devised without departing from the basic scope thereof.

The invention claimed is:

1. A system for linear motion comprising:
a processing chamber having a chamber body defining an interior space;
a linear motor coupled to the processing chamber, the linear motor comprising:
a housing disposed outside of the interior space and sealed to the chamber body, the housing having a cavity in fluid communication with the interior space;
a slider disposed at least partially in the cavity, the slider configured to slide relative to the housing in the cavity; and
at least one electromagnetic coil surrounding the housing;
a position measurement device coupled to the housing and configured to measure a position of the slider relative to the cavity; and
a controller configured to control power to the at least one electromagnetic coil based on the measured position.

2. The system according to claim 1, wherein the housing has a sealing flange sealed to the chamber body.

3. The system according to claim 2, wherein the housing has a tubular body extending longitudinally from a closed end to an open end that is surrounded by the sealing flange.

4. The system of claim 2, wherein the sealing flange has a groove configured to receive an o-ring.

5. The system of claim 4, further comprising an o-ring seated in the groove.

6. The system of claim 1, wherein the slider includes a sleeve having an outer bearing surface formed of plastic.

7. The system of claim 1, further comprising:
a substrate support disposed in the interior space, the substrate support having at least one through hole; and
a lift pin extending from an end of the slider and moveable with the slider to cause movement of the lift pin through the at least one through hole.

8. A system comprising:
a processing chamber having a chamber body;
a housing having a cavity and a sealing flange configured to seal with the chamber body; and
a slider disposed at least partially in the cavity, the slider configured to slide relative to the housing in the cavity; and
at least one electromagnetic coil surrounding the housing;
a position measurement device coupled to the housing and configured to measure a position of the slider relative to the cavity; and
a controller configured to control power to the at least one electromagnetic coil based on the measured position.

9. The system of claim 8, wherein the housing has a tubular body extending longitudinally from a closed end to an open end that is surrounded by the sealing flange.

10. The system of claim 9, wherein the sealing flange has a groove configured to receive an o-ring.

11. The system of claim 9, wherein the slider includes a sleeve having an outer bearing surface formed of plastic.

12. The system of claim 11, wherein the outer bearing surface is comprised of a polymer coating having a thickness of 0.002 inch to 0.006 inch.

13. The system of claim 9, wherein the housing is formed of metal.

14. The system of claim 13, wherein the metal is stainless steel or aluminum.

15. The system of claim 9, wherein the housing is formed of plastic.

16. The system of claim 9, wherein the slider includes a sleeve and a plurality of permanent magnets disposed in the sleeve.

17. A system for lift pin motion comprising:
a processing chamber having a chamber body defining an interior space;
a linear motor comprising:
a housing disposed outside of the interior space and having a sealing flange sealed to the chamber body, the housing having a cavity in fluid communication with the interior space;

a slider disposed at least partially in the cavity, the slider configured to slide relative to the housing in the cavity; and at least one electromagnetic coil surrounding the housing;

a substrate support disposed in the interior space, the substrate support having at least one through hole;

a lift pin extending from an end of the slider and moveable with the slider to cause movement of the lift pin through the at least one through hole; and a position measurement device coupled to the housing and configured to measure a position of the slider relative to the cavity; and a controller configured to control power to the at least one electromagnetic coil based on the measured position.

* * * * *